(12) United States Patent
Tanaka et al.

(10) Patent No.: US 6,982,002 B2
(45) Date of Patent: Jan. 3, 2006

(54) APPARATUS AND METHOD FOR FORMING COATING FILM

(75) Inventors: Takashi Tanaka, Kikuchi-gun (JP); Shinji Nagashima, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 326 days.

(21) Appl. No.: 10/068,838

(22) Filed: Feb. 11, 2002

(65) Prior Publication Data

US 2002/0110641 A1    Aug. 15, 2002

(30) Foreign Application Priority Data

Feb. 14, 2001    (JP) ............................. 2001-037466

(51) Int. Cl.
*B05C 13/00*    (2006.01)
(52) U.S. Cl. ........................ 118/52; 118/320
(58) Field of Classification Search ............... 239/402, 239/432, 500, 501, 502; 118/52, 612, 320
See application file for complete search history.

(56) References Cited

U.S. PATENT DOCUMENTS

| | | | | |
|---|---|---|---|---|
| 3,297,474 A | * | 1/1967 | Shields | 427/240 |
| 3,920,187 A | * | 11/1975 | Willis | |
| 4,603,813 A | * | 8/1986 | Luegering | 239/399 |
| 4,806,455 A | * | 2/1989 | LaBianca | |
| 5,069,156 A | * | 12/1991 | Suzuki | 118/52 |
| 5,968,268 A | | 10/1999 | Kitano et al. | |
| 6,059,880 A | | 5/2000 | Kitano et al. | |
| 6,376,013 B1 | * | 4/2002 | Rangarajan et al. | 427/240 |

* cited by examiner

*Primary Examiner*—Brenda A. Lamb
(74) *Attorney, Agent, or Firm*—Oblon, Spivak, McClelland, Maier & Neustadt, P.C.

(57) ABSTRACT

The apparatus of the present invention for forming a coating film on a substrate by applying a coating liquid to the substrate comprises: a spin chuck for holding the substrate; a motor for rotating the spin chuck; and a nozzle for dropping the coating liquid on the center surface of the substrate. The nozzle included a spiral groove or a plurality of fins for giving a gyrating force to the dropped coating liquid.

10 Claims, 6 Drawing Sheets

APPARATUS AND METHOD FOR FORMING COATING FILM

BACKGROUND OF THE INVENTION

1. Field of the Invention

The present invention relates to an apparatus and method for forming a coating film such as a photoresist film and interlayer dielectric on a substrate such as a semiconductor wafer.

2. Description of the Related Art

In the manufacturing process of a semiconductor device, a dielectric film such as an interlayer dielectric film is spin-coated on a semiconductor wafer by, for example, the sol-gel method, the silk method, the speed film method or the Fox method. When the sol-gel method or the silk method is employed, a coating liquid is coated on the cooled semiconductor wafer, then heated and cooled, and is cured, under heating and then cooling, in a low oxygen concentration atmosphere, thereby obtaining the interlayer dielectric film.

Here, the coating liquid is dropped at the center portion of a stationary semiconductor wafer and then the semiconductor wafer is rotated in order to extend the dropped coating liquid over the entire surface of the semiconductor wafer. Otherwise, the coating liquid is dropped onto a rotating semiconductor wafer.

In a spin-coating method as above-stated, most of the dropped coating liquid is spilt from the semiconductor wafer, and the spilt liquid is recovered and reused, or abandoned. However, it is costly to recover and reuse the wasted coating liquid, while it is also costly, if new coating liquid is purchased, always when it is needed, without recovery and reuse. Therefore, it is desired to minimize the amount of the coating liquid every coating process in order to reduce the cost of manufacturing the coated film on the semiconductor wafer.

Further, there is a problem that the coating film formation on the wafer by the spin-coating method tends to bring about the difference in film thickness between the center and the circumference of the wafer.

BRIEF SUMMARY OF THE INVENTION

It is an object of the present invention to provide an apparatus and method for forming coating film which are capable reducing an amount of a coating liquid supplied to a substrate.

It is another object of the present invention to provide an apparatus and method for forming coating film which are capable of improving uniformity of thickness of distribution of a coated film.

The apparatus of the present invention for forming a coating film on a substrate by applying a coating liquid to the substrate, which comprises:

holding means for holding the substrate horizontally;

a rotation mechanism for rotating said holding means such that the substrate held by said holding means is allowed to rotate in a horizontal plane;

a nozzle for dropping the coating liquid on the surface of the substrate; and gyrating force generation means for giving a gyrating force to the coating liquid dropped from said nozzle.

Further, the apparatus of the present invention for forming a coating film on a substrate by applying a coating liquid to the substrate, which comprise:

apparatus for forming a coating film on a substrate by applying a coating liquid to the substrate, which comprises:

holding means for holding the substrate horizontally;

a rotation mechanism for rotating said holding means such that the substrate held by said holding means is allowed to rotate in a horizontal plane; and a nozzle for dropping the coating liquid through a hole on the surface of the substrate, wherein a spiral groove is formed on an inner wall of the hole of said nozzle.

Further, the apparatus of the present invention for forming a coating film on a substrate by applying a coating liquid to the substrate, which comprises:

holding means for holding the substrate horizontally;

a rotation mechanism for rotating said holding means such that the substrate held by said holding means is allowed to rotate in a horizontal plane;

a nozzle for dropping the coating liquid through a hole on the surface of the substrate on said holding means; and a plurality of fins provided in the hole of said nozzle so as to flow the coating liquid in a spiral manner.

Further, the method of the present invention for forming a coating film on a substrate by applying a coating liquid to the substrate, which comprises the steps of:

rotating the substrate; and dropping the coating liquid given a gyrating force, which is in the same direction as that of the substrate, at the center of the substrate, thereby easily extending the dropped coating liquid to the circumference of the substrate to reduce the amount of the coating liquid supplied to the substrate.

Further, the method of the present invention for forming a coating film on a substrate by applying a coating liquid to the substrate, which comprises the steps of:

rotating the substrate; and dropping the coating liquid given a gyrating force, which is in the opposite direction to that of the substrate, at the center of the substrate, thereby controlling a extension of the dropped coating liquid to control a thickness of the coated film.

According to the present invention, the coating liquid dropped on the center surface of the substrate is easily extended over the entire surface of the substrate, because the dropped coating liquid is given a gyrating force.

Concretely, when the gyrating force of the dropped coating liquid is in the same direction as that of the substrate, the amount of the coating liquid supplied to the substrate is reduced, thereby reducing the production cost per substrate.

On the other hand, when the gyrating force of the dropped coating liquid is in the opposite direction to that of the substrate, the film thickness distribution can be controlled, thereby forming a more precise film.

Further, according to the present invention, the substrate holder rotates as if its rotation speed is increased due to the angular momentum of the dropped coating liquid. Therefore, the coating apparatus of the present invention is effective for a large scaled substrate which is difficult to be rotated stably at a higher speed and is effective for a high viscous coating liquid which is difficult to be extended over the entire surface of the substrate.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Although the apparatus and method for forming a coating film of the present invention is applicable for forming various films, the embodiment is limited to only one typical example of the formation of the interlayer dielectric film. The apparatus for forming the coating film of the present invention is employed in a coating process unit (SCT) included in a spin on dielectric (SOD) system which includes various kinds of wafer treatments. Therefore, first, the SOD system is explained.

Figure 1:
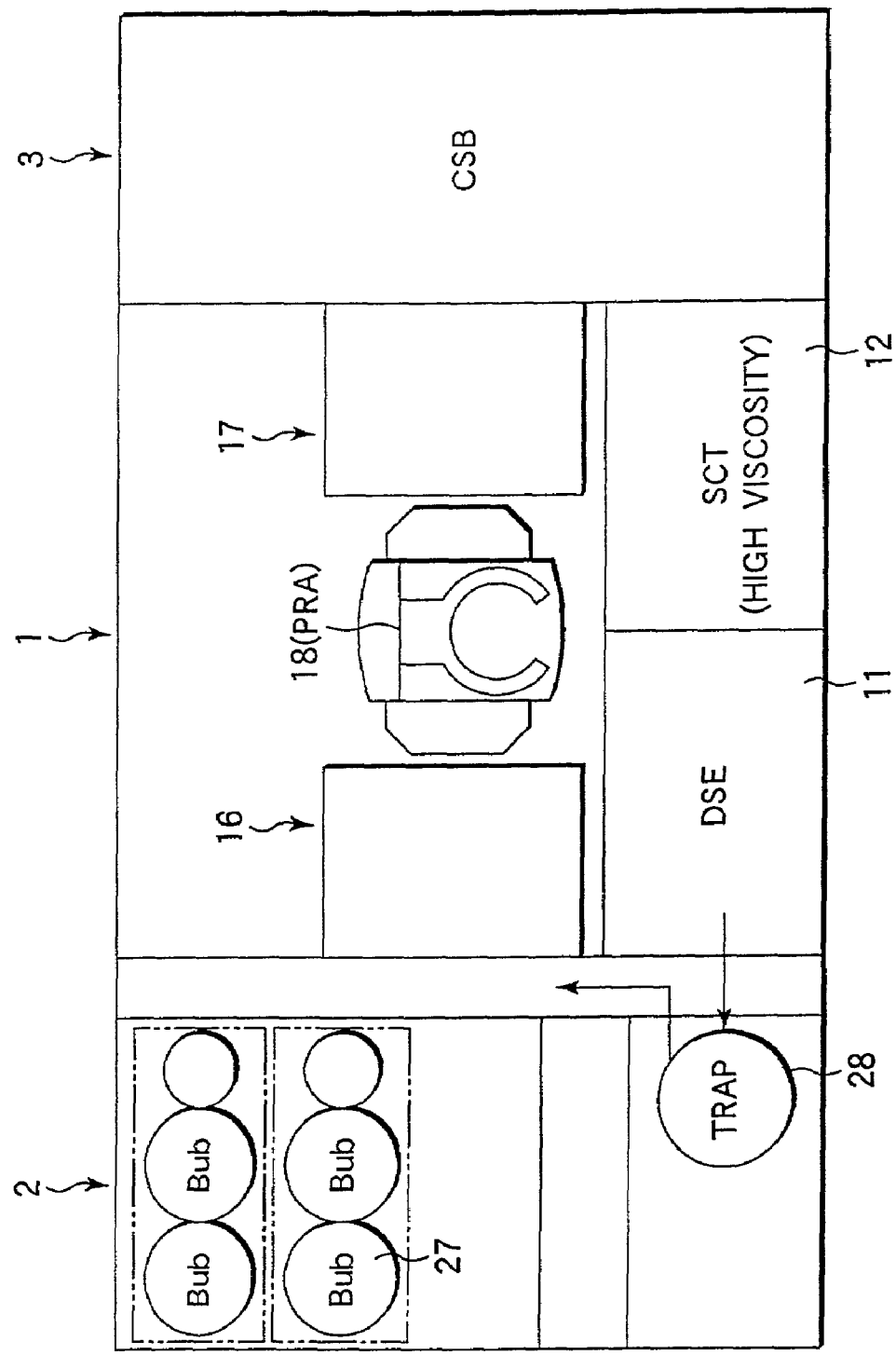
FIG. 1 is a top view of the spin on dielectric (SOD) system.

As shown in FIG. 1, the SOD system comprises a process section 1, a side cabinet 2, and a carrier station (CSB) 3. Solvent exchange unit (DSE) 11, a coating process unit (SCT) 12 for high viscosity coating liquid are arranged in an upper portion on the front side of the process section 1. Process unit groups 16, 17 are arranged in the central portion of the process section 1, and a wafer transfer mechanism (PRA) 18 for transferring a semiconductor wafer W is vertically movable between these process unit groups 16 and 17.

On the upper portion of the side cabinet 2, there are bublers (Bub) 27 for supplying chemical liquids and a trap (TRAP) 28 for cleaning exhausted gas.

Figure 2:
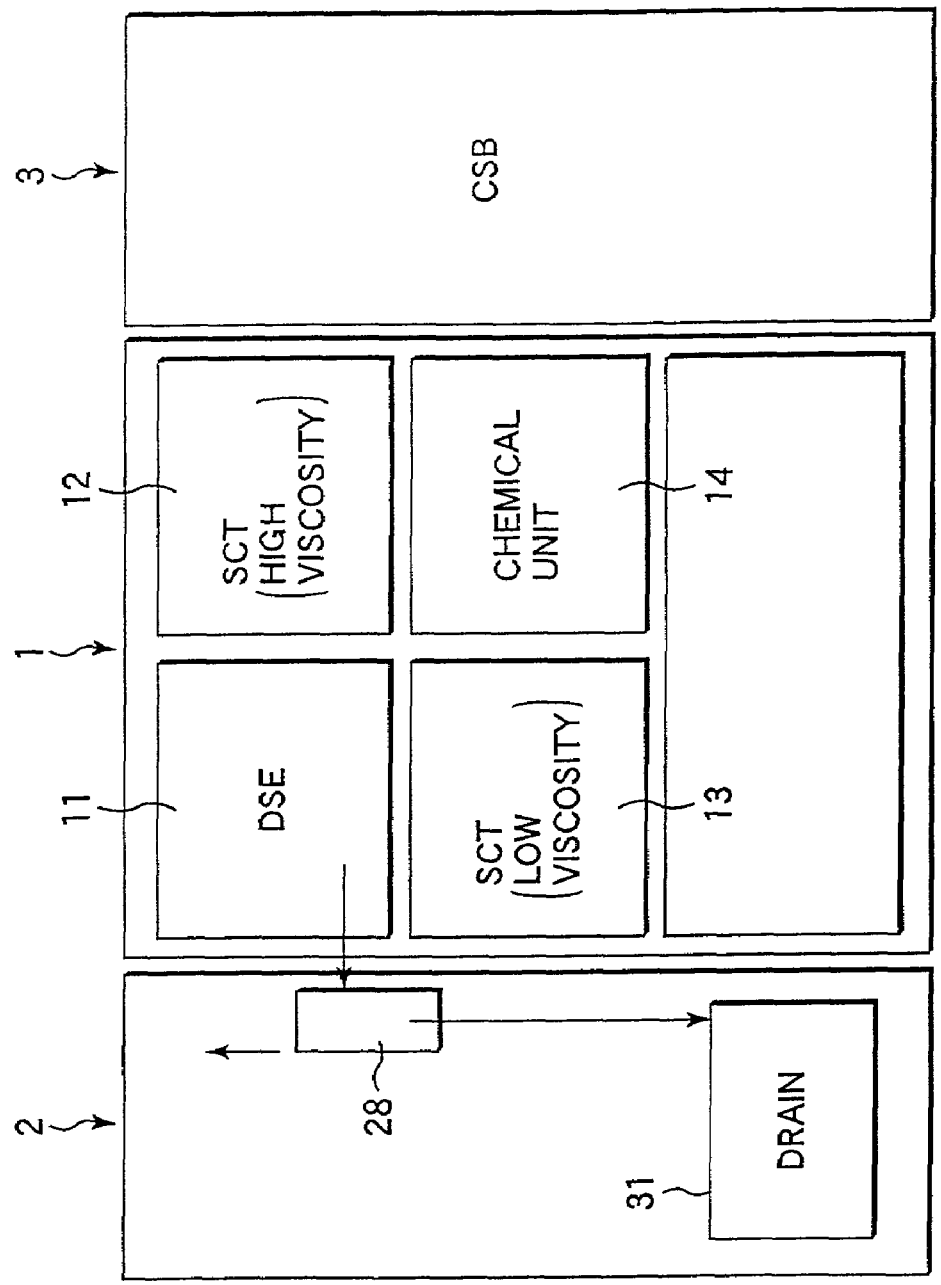
FIG. 2 is a front view of the SOD system as shown in FIG. 1.

As shown in FIG. 2, at the lower stair of the side cabinet 2, a power supply source (not shown in FIG. 2), a coating process unit (SCT) 13 for low viscosity coating liquid, a chemical unit 14 for storing a chemical liquid, and a drain 31 for discharging waste liquids used in the SOD system are arranged.

Figure 3:
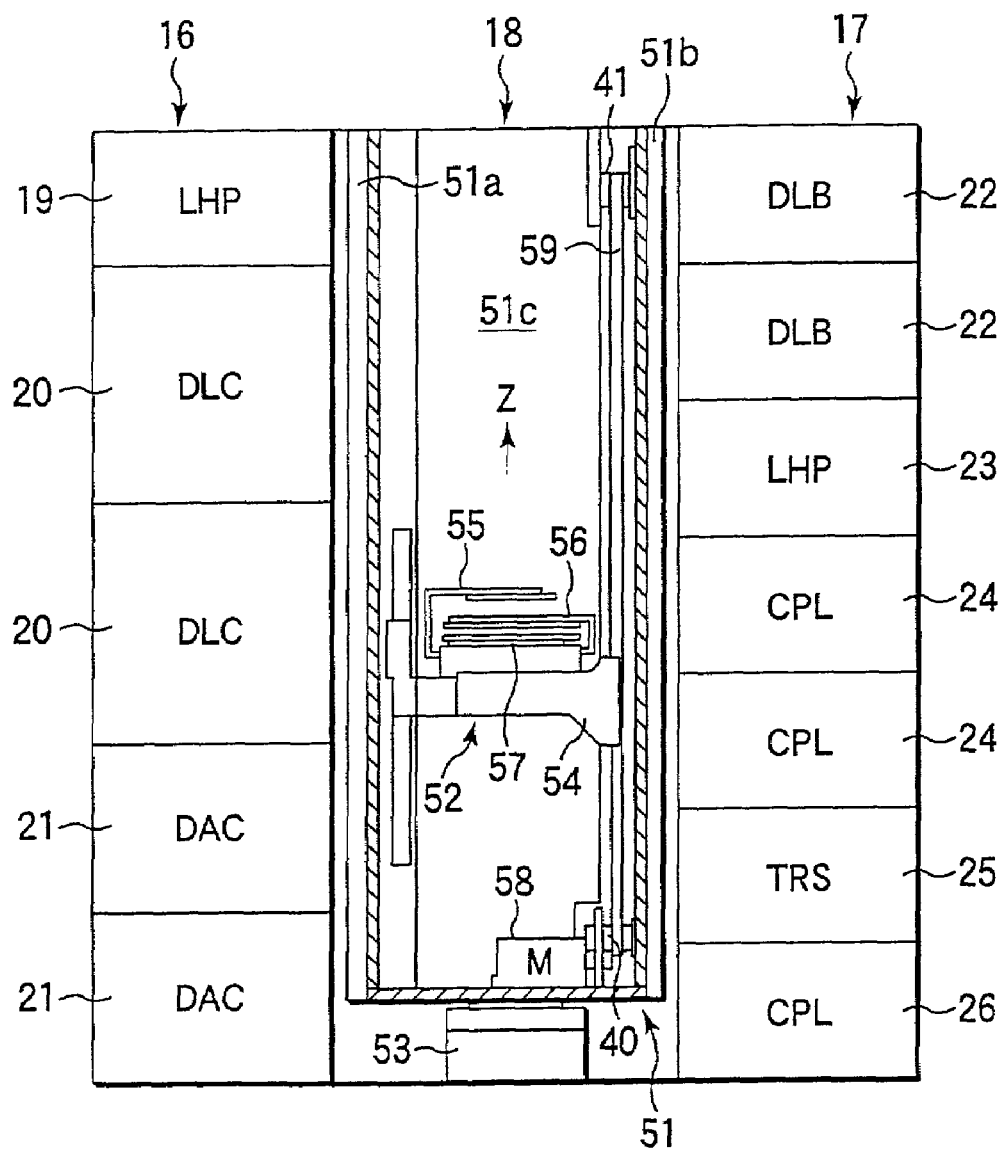
FIG. 3 is a front view of process unit groups in the SOD system as shown in FIG. 1.

As shown in FIG. 3, the wafer transfer mechanism (PRA) 18 includes a cylindrical support body 51 extending in a Z-direction and having vertical walls 51a, 51b and a side surface open portion 51c positioned between these vertical walls 51a and 51b, and a wafer transfer body 52 arranged inside the cylindrical support body 51 and vertically movable in the Z direction along the cylindrical support body 51. The cylindrical support body 51 can be rotated by a motor 53. In accordance with rotation of the cylindrical support body 51, the wafer transfer body 52 is also rotated.

The wafer transfer body 52 includes a transfer base 54, and three wafer transfer arms 55, 56, 57 movable back and forth along the transfer base 54. The wafer transfer arms 55, 56, 57 are of sizes capable of passing through the side surface open portion 51c of the cylindrical support body 51. These wafer transfer arms 55, 56, 57 can be independently moved back and forth by a motor and a belt mechanism arranged within the transfer base 54. The wafer transfer body 52 can be moved in the vertical direction by driving a belt 59 by a motor 58. Further, a reference numeral 40 shown in FIG. 3 denotes a driving pulley, and a reference numeral 41 denotes a driven pulley.

The process unit group 16 on the left hand side comprises a low temperature hot plat unit (LHP) 19, two cure units (DLC) 20, and two aging units (DAC) 21, which are stacked one upon the other as viewed from the upper side. On the other hand, the process unit group 17 on the right hand side includes two baking units (DLB) 22, a low temperature hot plate unit (LHP) 23, two cooling plate units (CPL) 24, a transport unit (TRS) 25, and a cooling plate unit (CPL) 26, which are stacked one upon the other as viewed from the upper side. Here, the transport unit (TRS) 25 also can functions as the cooling plate unit.

When an interlayer dielectric film is formed on a wafer W by means of, for example, the sol-gel method by using the SOD system described above, the wafer W is transferred through the cooling plate unit (CPL) 24 or 26, the coating process unit (SCT) 13 for low viscosity coating liquid, the aging unit (DAC) 21, solvent exchange unit (DSE) 11, the hot plate unit (LHP) 19 or 23, and the baking unit (DLB) 22, in that order for applying predetermined treatments to the wafer W.

Further, when an interlayer dielectric film is formed on the wafer W by means of the silk method or the speed film method, the wafer W is transferred through the cooling plate unit (CPL) 24 or 26, the coating process unit (SCT) 13 (for coating the adhesion promoter), the hot plate unit (LHP) 19 or 23, the coating process unit (SCT) 12 (for coating the chemical liquid for forming the film), the low temperature hot plate unit (LHP) 19 or 23, the baking unit (DLB) 22, and the cure unit (DLC) 20, in that order.

Further, when an interlayer dielectric film is formed on the wafer W by the Fox method, the wafer W is transferred through the cooling plate unit (CPL) 24 or 26, the coating process unit (SCT) 12, the low temperature hot plate unit (LHP) 19 or 23, the baking unit (DLB) 22 and the cure unit (DLC) 20, in that order.

Here, film materials are not limited to the above examples. Various organic, inorganic or hybrid materials are used.

Next, the coating process unit (SCT) 12 is explained, because the structure of the coating process unit (SCT) 13 is the same as that of the coating unit (SCT) 12.

Figure 4:
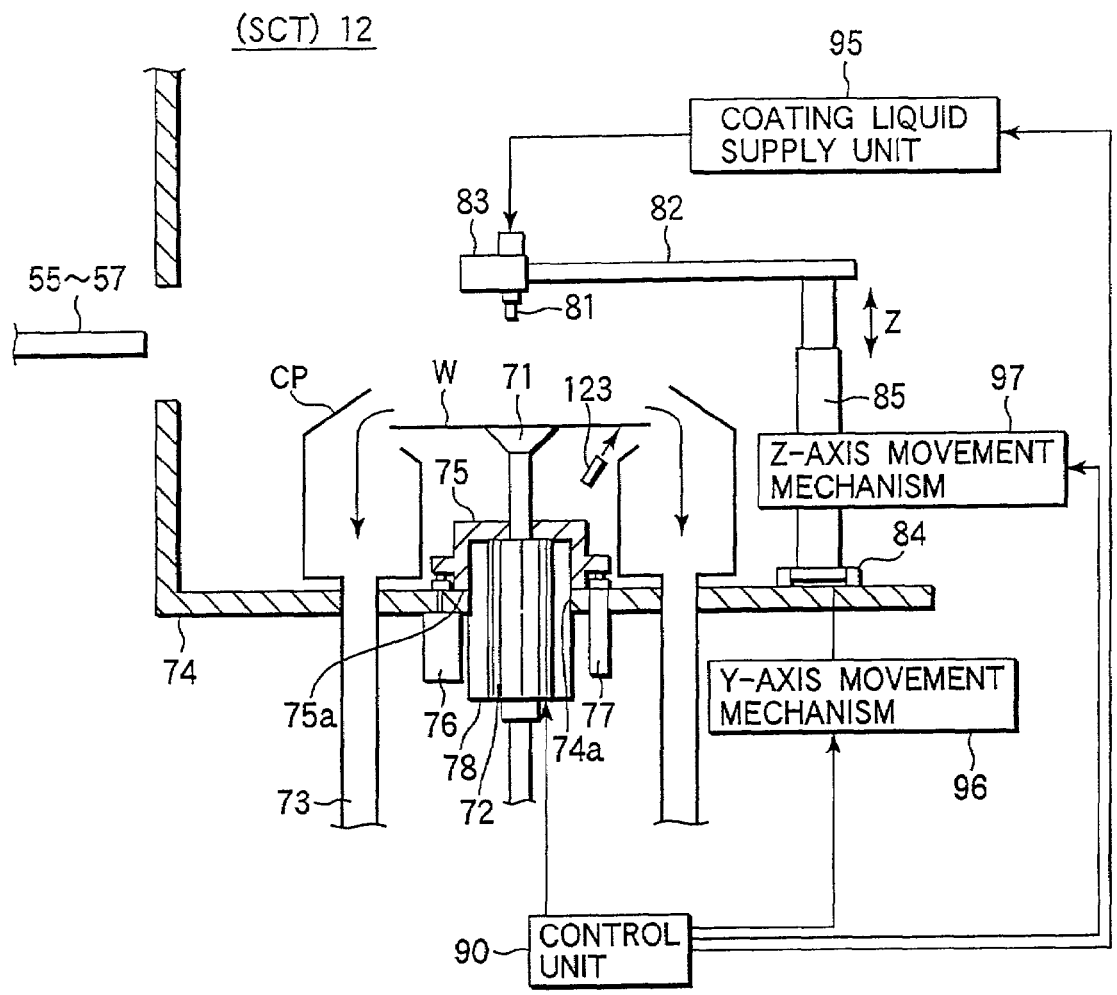
FIG. 4 is a cross sectional view of a coating process unit (SCT).
Figure 5:
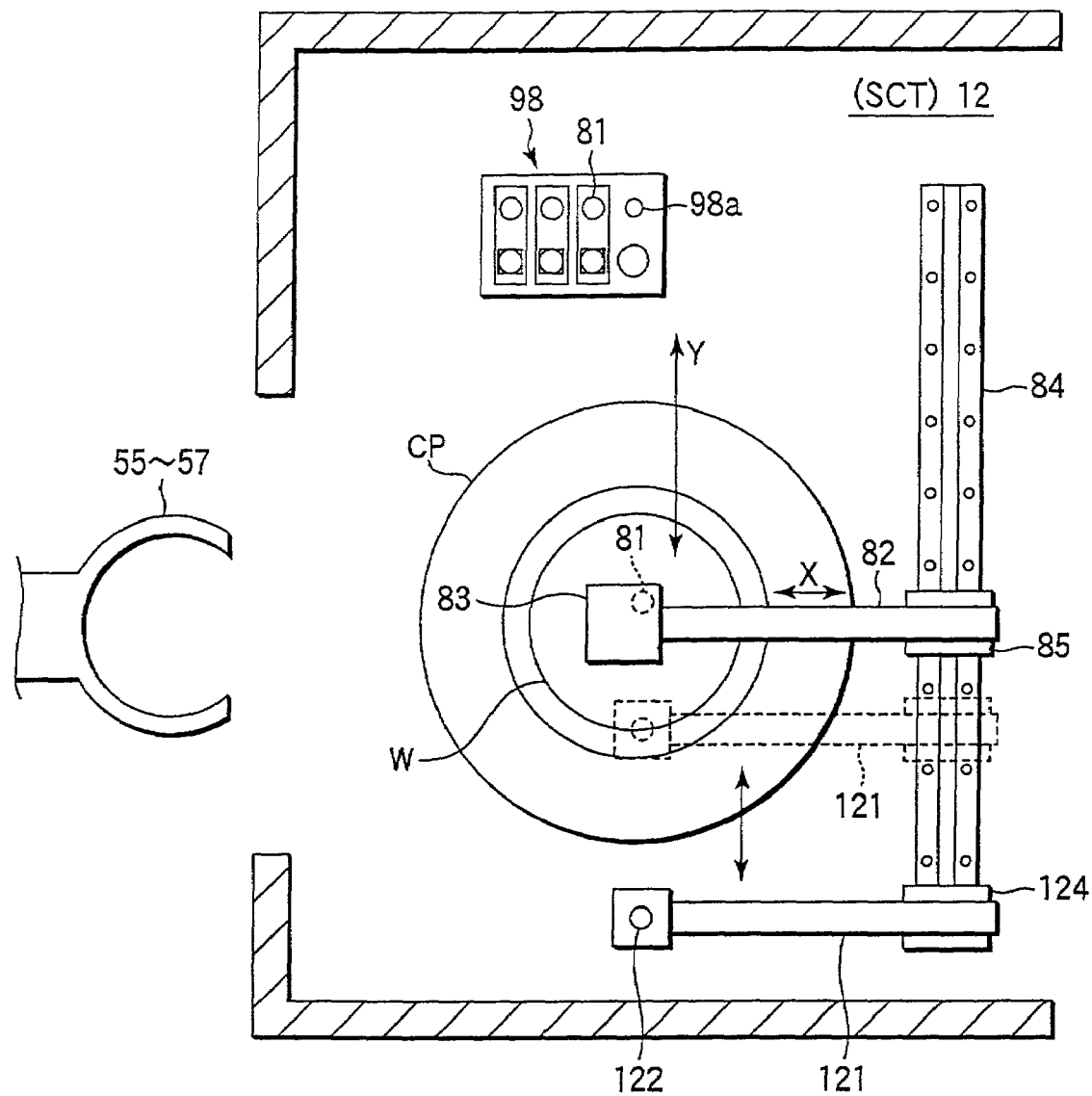
FIG. 5 is a plan view of the coating process unit (SCT).

FIG. 4 is a cross sectional view of the SCT 12, while FIG. 5 is a plan view of the SCT 12.

As shown in FIGS. 4 and 5, there are provided in the center of the coating process unit (SCT) 12 a circular coater cup (CP) and a spin chuck 71 inside the coater cup (CP). The spin chuck 71 is a vacuum chuck for holding the wafer W and is rotated by a motor 72. A waste liquid and a rinse liquid for rinsing the back of the wafer W after completing the coating of the coating liquid are discharged from a drain 73 at the bottom of the coater cup (CP).

The motor 72 is movable in the vertical direction through an aperture 74a at a unit bottom plate 74. Concretely, the motor 72 fixed to a cap flange 75 made of, for example, an aluminum is ascended and descended by an elevation guide 77 and an elevation mechanism 76 such as an air cylinder. More concretely, a cylindrical cooling jacket 78 made of, for example, a stainless SUS is fixed around the motor 72 and the upper half portion of the cylindrical cooling jacket 78 is fixed to the flange 75.

When the coating liquid is coated on the wafer w, the lower surface 75a of the flange 75 is in close contact with the unit bottom plate 74 near the outer circumference of the aperture 74a, thereby sealing the inside of the coating process unit (SCT). Further, when the wafer W is delivered between the spin chuck 71 and the wafer transfer arm 55, 56 or 57 of the wafer transfer mechanism (PRA) 18, the elevation mechanism 76 ascends the motor 72 and therefore the spin chuck 71,or in other words, the elevation mechanism 76 lifts up the flange 75 from the unit bottom plate 74.

A nozzle 81 for dropping the coating liquid on the surface of the wafer W is attached to and detached from a nozzle holder 83 at the leading edge of a scan arm 82. Further, the coating liquid is supplied from a coating liquid supply unit 95 to the nozzle 81.

Next, several embodiments of the nozzles 81A to 81 E are shown in FIGS. 6A to 6E, wherein the coating liquid flows in nozzle holes 61a, 61c, 61d towards nozzle exits 62a, 62c, respectively, and is rotated and dropped from each of the nozzle exits on to the wafer W.

Figure 6A:
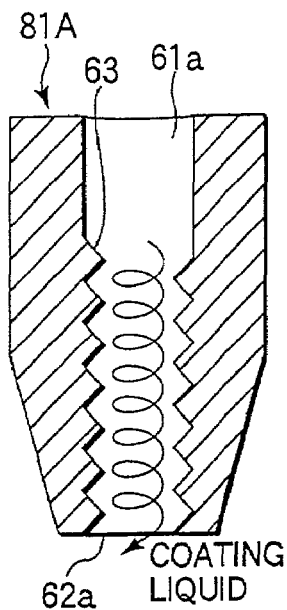
FIGS. 6A to 6E are cross sectional views of various nozzles for dropping a coating liquid.

A spiral groove 63 is provided toward the nozzle exit 62a in the wall of the nozzle hole 61a of the nozzle 81A as shown in FIG. 6A, thereby to flow the coating liquid along the spiral groove 63 and giving a gyrating force to the coating liquid.

Figure 6B:
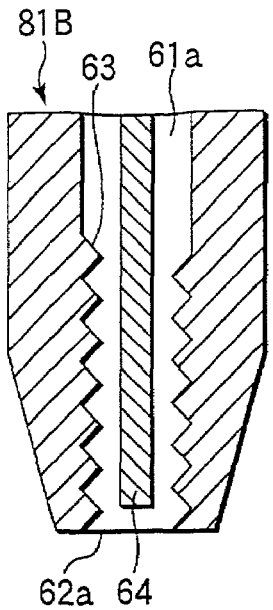

Further, in addition to a spiral groove 63 as shown in FIG. 6A, a center rod 64 is provided at the center of the nozzle hole 61a of the nozzle 81B as shown in FIG. 6B, thereby easily flowing the coating liquid along the spiral groove 63 and giving a greater gyrating force to the coating liquid.

Figure 6C:
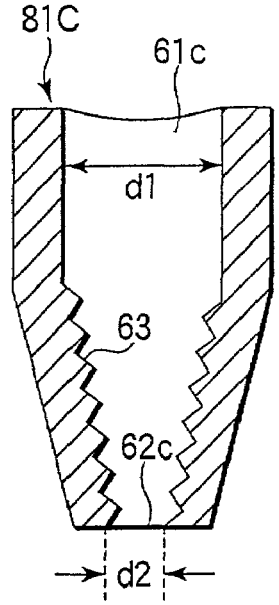

Further, there is provided in a nozzle 81C as shown in FIG. 6C a spiral groove 63 of which diameter d1 at the coating liquid supply side is greater than the diameter d2 at the nozzle exit 62c, thereby increasing a pressure of the flow of the coating liquid and giving a greater gyrating force to the coating liquid.

Figure 6D:
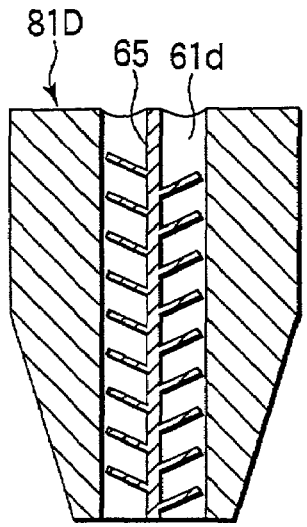

Further, there are provided in a straight nozzle hole 61d of a nozzle 81D as shown in FIG. 6D a screw-shaped fins 65 for the coating liquid to flow in a spiral manner. Further, the screw-shaped fins 65 may be rotated by a motor. Further, fins are not limited to the screw-shaped fins as far as the coating liquid is given the gyrating force.

Figure 6E:
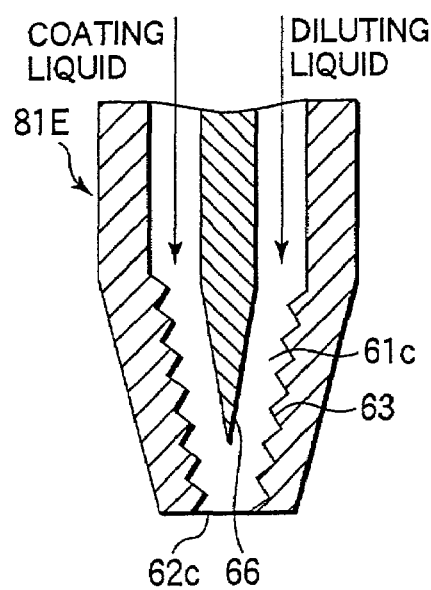

Further, a nozzle 81E as shown in FIG. 6E comprises: a spiral groove 63 of which diameter at the coating liquid supply side is greater than the diameter at the nozzle exit 62c, thereby increasing a pressure of the flow of the coating liquid and giving a greater gyrating force to the coating liquid; and a tapered center rod 66 for supplying separately the coating liquid and a diluting liquid for diluting the coating liquid and rotating and mixing them at the spiral groove 63 and dropping the mixed liquid from the nozzle exit 62c. Therefore, any extra mixing apparatus for the coating liquid and diluting liquid is required. Further, even the nozzles 81A to 81D may be used for supplying separately the coating liquid and the diluting liquid and mixing them at the spiral groove 63.

Continuously, other elements of the coating process unit (SCT) 12 are explained, referring to FIGS. 4 and 5.

The scan arm 82 is fixed on the upper edge of the vertical support member 85 on a guide rail 84 along Y direction on the unit bottom plate 74. Therefore, the scan arm 82 is moved by a Y-axis movement mechanism 96 along Y direction together with the vertical support member 85. Further, the nozzle 81 is moved vertically by a Z-axis movement mechanism 97.

Further, the nozzle 81 is moved along X-axis by a not shown X-axis movement mechanism, thereby selectively attaching one of the nozzles 81 at a nozzle standby section 98.

At the nozzle standby section 98, the nozzle exits 86 of the nozzles 81 are inserted into openings 98a of solvent atmosphere, thereby preventing the coating liquid from solidifying or degrading. A plurality of nozzles are prepared at the nozzle standby section 98 for various kind of a coating liquid.

There is provided on the guide rail 84 not only the vertical support arm 85 for supporting the scam arm 82 but also a vertical support arm 124 for supporting a rinse nozzle 122 scan arm 121 and moving it along Y direction. A rinse nozzle attached at the edge of the rinse nozzle scan arm 121 drops a rinse liquid at the circumference surface and circumference side wall of the wafer W, thereby dissolving, removing and cleaning an excessive coating liquid.

The rinse nozzle 122 together with the rinse nozzle scan arm 121 is moved, by the Y-axis movement mechanism 96, between a standby position as shown by solid lines and a position for dropping the rinse liquid as shown by dotted lines. Further, as shown in FIG. 4, another rinse nozzle 123 is provided below the circumference of the spin chuck 71, thereby blowing up the rinse liquid and cleaning the under surface of the wafer W. Here, the rinse liquid may be preferably volatile solvents such as a thinner included in the coating liquid.

A control unit 90 controls the motor 72, Y-axis movement mechanism 96, Z-axis movement mechanism 97, the coating liquid supply unit 95 and the not-shown rinse liquid supply unit and other mechanisms and units.

Next, a process for forming an interlayer dielectric film by the silk method and the speed film method is explained.

The wafer W transported from the carrier station (CSB) 3 to the transport unit (TRS) 25 is further transported by the wafer transfer mechanism (PRA) 18 to the cooling plate (CPL) 24 or 26 so as to be cooled there, thereby improving uniformity of thickness and qualities of manufactured films. Then, the wafer W is transported to the coating process unit (SCT) 13 for the low viscosity coating liquid in order to spin-coat on the wafer W the adhesion promoter as a first coating liquid, thereby improving an adhesion of the film with the wafer W.

When the adhesion promoter is spin-coated on the wafer W in the coating process unit (SCT) 13, the wafer W is moved just above the coater cup (CP) by one of the wafer transfer arm 55, 56, or 57 of the wafer transfer mechanism (PRA) 18. Then, the wafer W is vacuum-chucked by the spin chuck 71 which is elevated by the elevation mechanism 76 including an air cylinder and the elevation guide 77. Then, the wafer transfer mechanism (PRA) 18 takes out the wafer transfer arm 55, 56, or 57 from the coating process unit (SCT) 13, thereby completing the delivery of the wafer W.

Then, the spin chuck 71 is descended to a position where the wafer W is placed at a prescribed position in the coater cup (CP). Then, the motor 72 starts rotating the spin chuck 71. Then, the nozzle holder 83 standing by at the nozzle standby section 98 starts moving along Y direction until the nozzle exit of the nozzle 81 reaches the center of the wafer W, thereby dropping the coating liquid almost at the center of the rotating wafer W. The dropped coating liquid is extended by a gyrating force, thereby forming a coated film on the wafer W. The amount and pressure of the coating liquid dropped from the nozzle 81 should be controlled so as not to swallow any air bubble from the nozzle exit.

When one of the nozzles 81A to 81E is used, the dropped adhesion promoter is given a gyrating force in a prescribed direction of rotation. For example, when the wafer rotation is in a direction same as the rotation of the adhesion promoter, the adhesion promoter is easily expanded at the center portion of the wafer W. This results in the same effect that the wafer W is rotated at a higher revolution, the adhesion promoter is easily extended to the circumference of the wafer W and therefore, the amount of the dropped adhesion promoter can be reduced.

The above-explained method of dropping the coating liquid is particularly effective for a large sized wafer W and for a high viscous coating liquid.

Further, if the wafer rotation is in an opposite direction to the rotation of the adhesion promoter, centripetal force acts on the adhesion promoter thereby controlling the diffusion, and therefore the thickness distribution of the film can be controlled.

The rotation speed of the wafer W may be changed after dropping the adhesion promoter I order to control the thickness of adhesion promoter film. The excessive amount of the adhesion promoter is dropped off at the outer circumference of the wafer W. Then, the nozzle 81 is moved along Y direction in order to return it back to the nozzle standby section 98. Then, if necessary, the rinse nozzle 123 blows up the rinse liquid to the back surface of the rotating wafer W for executing the back-rinse and the rinse nozzle 122 blows the rinse liquid to the side wall of the wafer W for executing the side-rinse. The rinse liquid for the back-rinse and the side-rinse may be one of the solvents for the adhesion promoter.

After completing spilling off the rinse liquid on the wafer W, the wafer rotation is stopped. Then, the wafer W is carried out from the coating process unit (SCT) 13 by using the transfer arm 55, 56, or 57 in a reverse order of carrying in the wafer W into the coating process unit (SCT) 13, and is transported to the cooling plate unit (CPL) 24 or 26 for the temperature controlling.

The temperature-controlled wafer W is transported to the coating process unit (SCT) 12 for a high viscosity coating liquid in order to spin-coat a main coating liquid as a second coating liquid. The main coating liquid is dropped from the nozzle 81 by a manner similar to the adhesion promoter which is given a gyrating force by one of the nozzles 81A to 81E. After completing the coating of the main coating liquid, the wafer W is transported to a low temperature hot plate unit (LHP) 19 or 23 in order to remove components such as water which is evaporated at a relatively low temperature.

Then, in accordance with the solvents of the main coating liquid, the wafer W is heated in the baking unit (DLB) 22 and then is cured in the cure unit (DLC) 20, or the wafer W is directly transported to the cure unit (DLC) 20.

The heat treatment temperature in the baking unit (DLB) 22 is higher than that in the low temperature hot plate unit (LHP) 19 or 23 and is lower than that in the cure unit (DLC) 20 which removes evaporates and sublimates the residual solvents or other components which were not removed in the low temperature hot plate unit (LHP) 19 or 23. Further, in the cure unit (DLC) 20, the film of the main coating liquid is cured by heating at a temperature higher than that in the baking unit (DLB) 22 and then cooling, thereby forming the interlayer dielectric film.

Then, the wafer W is carried out of the cure unit (DLC) 20 by the transfer arm 55, 56, or 57 of the wafer transfer mechanism (PRA) 18, and is brought back to the carrier station (CSB) 3 through the transport unit (TRS) 25.

The present invention is not limited to the above-explained embodiments of the coating process units (SCT) 12 and 13. The apparatus of the present invention is applied not only for the interlayer dielectric film but also for a photoresist film. According to the present invention, the amount of the photoresist supplied to a wafer W is reduced, thereby reducing a production cost.

Further, in the process of forming the photoresist film, a pre-wet process for coating on the wafer W a solvent such as a thinner included in the photoresist may be added before coating the photoresist liquid. The amount of the photoresist liquid is further reduced by the pre-wet process.

Further, the present invention is not only applied to the semiconductor wafer but also other kinds of substrates such as substrates for liquid crystal display (LCD) apparatuses.

The embodiments described above are simply intended to clarify the technical concept of the present invention. Of course, the present invention should not be limited to the embodiments described above in interpreting the technical scope of the present invention. The present invention can be worked in variously modified fashions within the spirit of the present invention and within the scope defined by the accompanying claims.

What is claimed is:

1. An apparatus for forming a coating film, comprising:
   holding means for holding a substrate horizontally;
   a rotation mechanism configured to rotate said holding means such that the substrate held by said holding means is allowed to rotate in a horizontal plane;
   a nozzle configured to drop a coating liquid through a hole on a surface of the substrate;
   a center rod provided at a center of the hole and configured to flow the coating liquid along the inner wall of the hole; and
   a spiral groove formed on an inner wall of the hole of said nozzle, the spiral groove extending to a position adjacent an exit of the nozzle and configured to gyrate the coating liquid such that the coating liquid continues to gyrate after being dropped from the nozzle.

2. The apparatus according to claim 1, wherein the spiral groove is configured such that the coating liquid and a dilution liquid configured to dilute the coating liquid supplied separately are mixed during passing the spiral groove, and the mixed liquid is given a gyrating force and is dropped from said nozzle.

3. The apparatus according to claim 1, wherein the hole is tapered toward the exit of the nozzle.

4. An apparatus for forming a coating film, comprising:
   holding means for holding a substrate horizontally;
   a rotation mechanism configured to rotate the holding means such that the substrate held by the holding means is allowed to rotate in a horizontal plane; and
   a nozzle configured to drop a coating liquid through a hole on a surface of the substrate,
   a spiral groove formed on an inner wall of the hole of the nozzle, and
   a center rod provided at a center of the hole and configured to flow the coating liquid along the inner wall of the hole,
   wherein the nozzle is configured to drop the coating liquid with a gyration in accordance with the spiral groove.

5. The apparatus according to claim 4, wherein the spiral groove is configured such that the coating liquid and a dilution liquid configured to dilute the coating liquid supplied separately are mixed during passing said spiral groove, and the mixed liquid is given a gyrating force and is dropped from said nozzle.

6. An apparatus for forming a coating film on a substrate by applying a coating liquid to the substrate, comprising:
   holding means for holding the substrate horizontally;
   a rotation mechanism for rotating said holding means such that the substrate held by said holding means is allowed to rotate in a horizontal plane;

a nozzle configured to drop the coating liquid through a hole on a surface of the substrate on said holding means;

a center rod provided at a center of the hole such that the coating liquid flows along an inner wall of the hole, the center rod extending to a position adjacent an exit of the nozzle; and a plurality of fins disposed on the center rod and configured to flow the coating liquid in a spiral manner, the plurality of fins extending to a position adjacent the exit of the nozzle.

7. The apparatus according to claim 6, wherein the hole is configured such that the coating liquid and a dilution liquid configured to dilute the coating liquid supplied separately are mixed during passing through the hole, and the mixed liquid is given a gyrating force by the plurality of fins and is dropped from said nozzle.

8. The apparatus according to claim 6, wherein the hole is tapered toward the exit of the nozzle.

9. An apparatus for forming a coating film on a substrate by applying a coating liquid to the substrate, comprising:

a holder configured to hold the substrate horizontally;

a rotation mechanism configured to rotate the holder such that the substrate held by the holder is allowed to rotate in a horizontal plane;

a nozzle configured to drop the coating liquid on a surface of the substrate;

a gyrating force generator configured to give a gyrating force to the coating liquid such that the coating liquid continues to gyrate after being dropped from the nozzle, the gyrating force generator extending to a position adjacent an exit of the nozzle; and a center rod provided at a center of the hole of the nozzle and configured to flow the coating liquid along an inner wall of the nozzle.

10. An apparatus for forming a coating film on a substrate by applying a coating liquid to the substrate, comprising:

a holder configured to hold the substrate horizontally;

a rotation mechanism configured to rotate the holder such that the substrate held by the holder is allowed to rotate in a horizontal plane; and a nozzle configured to drop the coating liquid through a hole on a surface of the substrate, wherein a spiral groove is formed on an inner wall of the hole of the nozzle, and wherein a center rod is provided at a center of the hole such that the coating liquid flows along the inner wall of the hole.

* * * * *